United States Patent [19]
Yu

[11] Patent Number: 5,912,494
[45] Date of Patent: Jun. 15, 1999

[54] INTERNAL ESD PROTECTION STRUCTURE WITH CONTACT DIFFUSION

[75] Inventor: Ta-Lee Yu, Hsin Chu Hsien, Taiwan

[73] Assignee: Winbond Electronics Corporation, Hsinchu, Taiwan

[21] Appl. No.: 08/630,735

[22] Filed: Apr. 2, 1996

[51] Int. Cl.[6] .................................................. H01L 23/62
[52] U.S. Cl. ........................... 257/355; 257/408; 257/382
[58] Field of Search ..................................... 257/408, 382, 257/355

[56] References Cited

U.S. PATENT DOCUMENTS 5,569,947 10/1996 Iwasa et al. ............................. 257/382

FOREIGN PATENT DOCUMENTS 0356039 2/1990 European Pat. Off. ............... 257/408

OTHER PUBLICATIONS

C. Duvvury, R. Rountree & O. Adams, *Internal Chip ESD Protection Beyond the Circuit*, I.E.E.E Trans. Of Elec. Devs., vol. 35, No. 12, pp. 2133–2138, Dec., 1988.

J.LeBlanc & M. Chaine, *Proximity Effects of "unused" Output Buffers on ESD Performance*, I.E.E.E. IRPS Proc., pp. 327–330 (1991), Dec. 1991.

*Primary Examiner*—Mark V. Prenty
*Attorney, Agent, or Firm*—Proskauer Rose LLo

[57] ABSTRACT

An ESD protected structure and method of its fabrication are disclosed. A heavily doped polycrystalline silicon region of a first conductivity type is disposed on a substrate surface and is connected to a power supply voltage. A lightly doped region, of the first conductivity type, is disposed below the substrate surface and below the polycrystalline silicon region. A first heavily doped region, of the first conductivity type, of a first MOS device is disposed below the substrate surface, and contained entirely within the lightly doped region. A second heavily doped region, of the first conductivity type, of a second MOS device, is disposed below the substrate surface, and separated from the first region by a portion of the lightly doped region and a second conductivity type doped portion of the substrate. The separation of the first and second regions by a portion of the lightly doped region increases a turn-on voltage of a parasitic bipolar junction device that includes the first and second regions, the portion of the lightly doped region and the second conductivity type doped portion of the substrate. The increase in turn on voltage, in turn, tends to prevent the bipolar junction device from turning on, during an ESD event, before an ESD protection device that protects the structure from ESD events which occur within the power supply voltage. According to the fabrication process, the heavily doped polycrystalline silicon region is formed on the substrate surface and impurities are thermally diffused therefrom below the substrate surface to form the lightly doped region.

8 Claims, 4 Drawing Sheets

INTERNAL ESD PROTECTION STRUCTURE WITH CONTACT DIFFUSION

Related Application

The subject matter of this application is related to the subject matter of the following patents and patent applications:

1. U.S. Pat. No. 5,438,005, entitled, "Deep Collection Guard Ring," filed Apr. 13, 1994 for Dr. Wen-Yueh Jang;
2. U.S. patent application Ser. No. 08/227,355, entitled, "ESD Protection Device," filed Apr. 13, 1994 for Dr. Wen-Yueh Jang now U.S. Pat. No. 5,545,910,
3. U.S. patent application Ser. No. 08/543,397, entitled, "ESD Protection Device," filed Oct. 16, 1995 for Dr. Wen-Yueh Jang now abandoned, and
4. U.S. patent application Ser. No. 08/476,312, entitled, "Deep Collection Guard Ring," filed, Jun. 7, 1995 for Dr. Wen-Yueh Jang.

All of the above-listed patents and patent applications are commonly assigned to the assignee of this application and are incorporated herein by reference.

FIELD OF THE INVENTION

The present invention relates to improving the electrostatic discharge (ESD) protection of semiconductor components and structures of integrated circuits.

BACKGROUND OF THE INVENTION

ESD protection is an important consideration in integrated circuit design, particularly, as semiconductor structure and component dimensions are scaled down to deep submicron (i.e., less than 0.65 $\mu$m) resolutions. During an ESD event, charge is transferred at a high voltage to a pin of an integrated circuit chip during a short duration, i.e., typically less than 1 $\mu$sec. Most semiconductor integrated circuits include MOS devices such as MOSFETs with very thin gate oxides or lightly doped drains and sources which are highly susceptible to damage during ESD events. As such devices are made smaller, they can be damaged by even lower voltage ESD events.

FIG. 1 depicts a schematic of an ESD protection circuit 10 of an integrated circuit. Circuits 16 and 18 provide ESD protection to input buffer 12 from ESD voltages which may be applied to the input pad 14. When an ESD event occurs, the diodes of the circuit 16 shunt most of the ESD charge. When the polarity of the ESD voltage is negative, diode D1 shunts ESD charge to the $V_{SS}$ bus and when the polarity of the ESD voltage is positive, diode D2 shunts ESD charge to the $V_{DD}$ bus. The circuit 18 includes a resistor R connected in series with a grounded FET clamp M0. The circuit 18 limits the voltage which is applied across the gates of the input buffer 12. The core clamp 20 provides ESD protection to the $V_{DD}$ and $V_{SS}$ power busses by transferring ESD charge between the $V_{DD}$ and $V_{SS}$ power busses during an ESD event.

Most ESD protection devices are designed to be triggered when a high ESD voltage is applied between two pins of an integrated circuit chip. However, recent attention has been directed to protecting against ESD voltages which may be applied across power busses of the integrated circuit chip. See C. Duvvury, R. Rountree & O. Adams, *Internal Chip ESD Protection Beyond the Protection Circuit*, I.E.E.E TRANS. OF ELEC. DEVS., vol. 35, no. 12, p. 2133–38, Dec., 1988; J. LeBlanc & M. Chaine, *Proximity Effects of "unused" Output Buffers on ESD Performance*, I.E.E.E. IRPS PROC., p. 327–30 (1991). These references note that the ESD protection circuits provided between the $V_{DD}$ and $V_{SS}$ pins may not provide sufficient protection to the internal devices of the chip. Rather, the chip may, by virtue of the layout of the regions and structures of the internal devices, incorporate parasitic bipolar junction devices which turn-on in advance of the triggering of the ESD protection circuits resulting in damage to the internal devices.

Consider, for example, the circuits depicted in FIGS. 2–4. FIG. 2 depicts the schematic of two closely placed internal circuits. In particular, a first circuit 22 includes an NMOS transistor N1 which is placed laterally adjacent to an NMOS transistor N2 of a second circuit 24. An overhead view of this configuration is shown in FIG. 3 and a cross-section of this configuration, taken at the line X-X', is shown in FIG. 4. The transistor N1 has a gate 30, a source 36 and a drain 38. The source 36 and drain 38 are N$^+$ regions which extend from the surface of a substrate 34. The transistor N2 has a gate 30', a source 40 and a drain 42. Like the transistor N1, the source 40 and drain 42 are N$^+$ regions which extend from the surface of the substrate 34.

The drain 38 of transistor N1 is connected to the $V_{DD}$ power bus line 32 by contacts 28 and the source 40 of the transistor N2 is connected to the $V_{SS}$ power bus line 32' by contacts 28'.

As shown in FIG. 4, the drain 38 is adjacent, and in close proximity, to the source 40. The N$^+$ drain region 38, N+ source region 40 and P-conductivity type bulk substrate 34 between the source 40 and drain 38 form an NPN parasitic bipolar junction device 44. During an ESD event, an ESD voltage may be applied between the $V_{DD}$ power bus line 32 and the $V_{SS}$ power bus line 32'. Because of the proximity of the N' drain 38 and source 40 region, the requisite turn-on voltage of the parasitic BJT (bipolar junction transistor) 44 can be as low as 13 volts. The ESD voltage between the $V_{DD}$ and $V_{SS}$ power bus lines 32 and 32' may be sufficiently high to turn on the parasitic BJT 44 and cause it to operate in "snap-back" mode. This can result in the flow of a large current which can damage the components and structures of the integrated circuit. Note the BJT 44 can turn on at a lower voltage than the circuit which provides ESD protection for ESD events that occur on the power busses (e.g., the core clamp circuit 20 of FIG. 1) and thereby cause damage during an ESD event despite the provision of such ESD protection circuitry.

The prior art has suggested to avoid such internal damage owing to parasitic bipolar junction devices by increasing the spacing between various components and structures (e.g., between the drain 38 and the source 40 of the transistors N1 and N2) by 20 $\mu$m. However, this wastes a large amount of precious space on the integrated circuit chip thereby reducing the density of structures and components on each integrated circuit chip. Furthermore, this does not completely prevent the parasitic bipolar junction device from damaging the integrated circuit.

It is therefore an object of the present invention to overcome the disadvantages of the prior art.

SUMMARY OF THE INVENTION

This and other objects are achieved by the present invention. According to one embodiment, an ESD protected structure is provided with a heavily doped polycrystalline silicon region of a first conductivity type. The heavily doped polycrystalline silicon region is disposed on a substrate surface and is connected to a power supply voltage. A lightly doped region, of the first conductivity type, is disposed below the substrate surface and below the polycrystalline silicon region. A first heavily doped region, of the first conductivity type, of a first MOS device is disposed below the substrate surface, and contained entirely within the lightly doped region. A second heavily doped region, of the first conductivity type, of a second MOS device, is disposed below the substrate surface, and separated from the first region by a portion of the lightly doped region and a second conductivity type doped portion of the substrate.

Illustratively, the separation of the first and second regions by a portion of the lightly doped region increases a turn-on voltage of a bipolar junction device that includes the first and second regions, the portion of the lightly doped region and the second conductivity type doped portion of the substrate. (The bipolar junction device illustratively is a parasitic BJT in which the first region and lightly doped region form the collector, the second conductivity type portion of the substrate forms the base, and the second region forms the emitter of the parasitic BJT.) The increase in turn on voltage, in turn, tends to prevent the bipolar junction device from turning on, during an ESD event, before an ESD protection device that protects the structure from ESD events which occur within the power supply voltage.

According to another embodiment, the ESD protected structure is fabricated as follows. The heavily doped polycrystalline silicon region, of a first conductivity type, is formed on a substrate surface. Impurities are illustratively thermally diffused from the polycrystalline silicon region below the surface to form the lightly doped region of the first conductivity type. The first heavily doped region of the first conductivity type of the first MOS device is formed below the substrate surface, and entirely within the lightly doped region. The second heavily doped region of the first conductivity type of the second MOS device is formed below the substrate surface at a particular location such that the first and second heavily doped regions are separated by a portion of the lightly doped region and a second conductivity type portion of the substrate.

In short, an ESD protected structure, and method of its fabrication, are provided. The ESD protected structure is easy to form using MOS fabrication compatible processes and reduces damage to internal circuits from ESD events which occur on the power busses.

DETAILED DESCRIPTION OF THE INVENTION

The fabrication of an ESD protected structure according to an embodiment of the present invention is illustrated in FIGS. 5–12. For sake of illustration, fabrication of a CMOS device is used although the discussion herein is limited to the formation of an ESD protected structure in an NMOS device of the CMOS device. Those having ordinarily skill in the art will appreciate that the discussion may be applied equally to construction of ESD protected structures in a PMOS device of the CMOS device.

Figure 5:
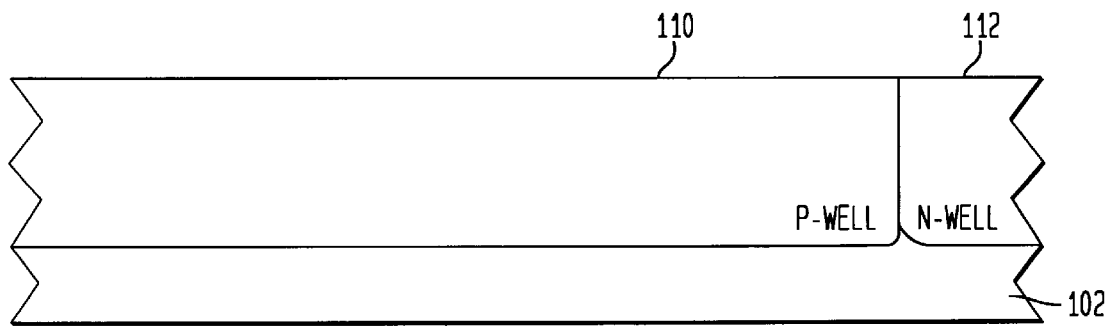
FIGS. 5–12 show the fabrication steps of an ESD protected structure according to an embodiment of the present invention.

In FIG. 5, a P well 110 and an N well 112 are formed in a substrate 102 by implantation or diffusion. The wells 110 and 112 may, for example, have a width of 20 $\mu$m and a depth of 1.9 $\mu$m. Illustratively, the P well 110 may be doped with B ions to a concentration of, for example, $8 \times 10^{16}$ cm$^{-3}$ whereas the N well 112 may be doped with P or As ions to a concentration of, for example, $2 \times 10^{15}$ cm$^3$.

Figure 6:
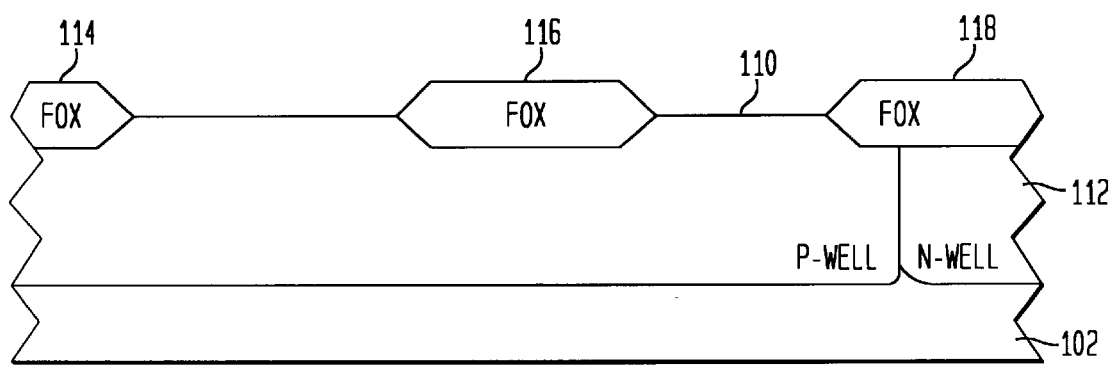

As shown in FIG. 6, field oxide (FOX) regions 114, 116 and 118 are formed on the substrate 102 surface. FOX regions 114, 116 and 118 may illustratively be formed using the well known LOCOS (local oxidation of silicon) process, wherein the substrate 102 surface is covered with a Si$_3$N$_4$ layer. The Si$_3$N$_4$ layer is patterned to uncover portions of the substrate 102 surface in the approximate vicinity of where the FOX regions 114, 116 and 118 are to be formed. The substrate is then heated in the presence of oxygen, e.g., for a time of 6 hours, so as to oxidize the exposed portions of the substrate 102 not covered by the Si$_3$N$_4$ layer.

Figure 7:
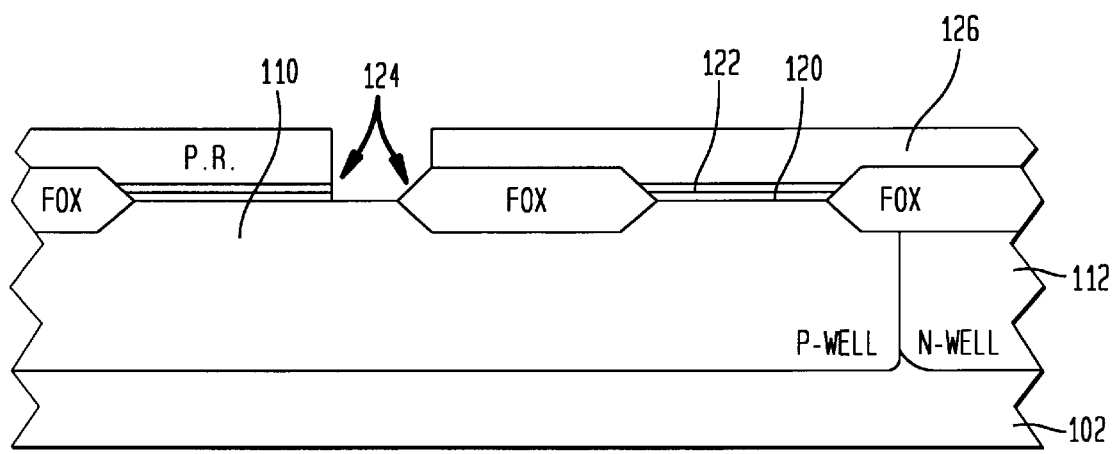

Next, as shown in FIG. 7, a thin gate oxide layer 120 is formed, e.g., grown, on the substrate 102 surface to a thickness of, for example, 100 Å. A thin poly layer 122 is then formed, e.g., deposited, on the thin oxide layer 120, which poly layer 122 may have a thickness of, for example, 600 Å. Using a photo-lithographic technique, the oxide layer 120 and poly layer 122 are patterned to uncover a surface window 124 of the substrate 102. Specifically, a photo-resist layer 126 is spun on the poly layer 122 and selectively exposed to light through a mask. The portions of the photo-resist layer 126 not exposed to light are removed to uncover a portion of the poly layer 122 approximately at the location at which the window 124 is to be formed. A suitable etchant, such as Cl$_2$, C$_2$F$_6$, is applied which etches through the poly layer 122 and thin oxide layer 120 to expose the surface window 124.

Figure 8:
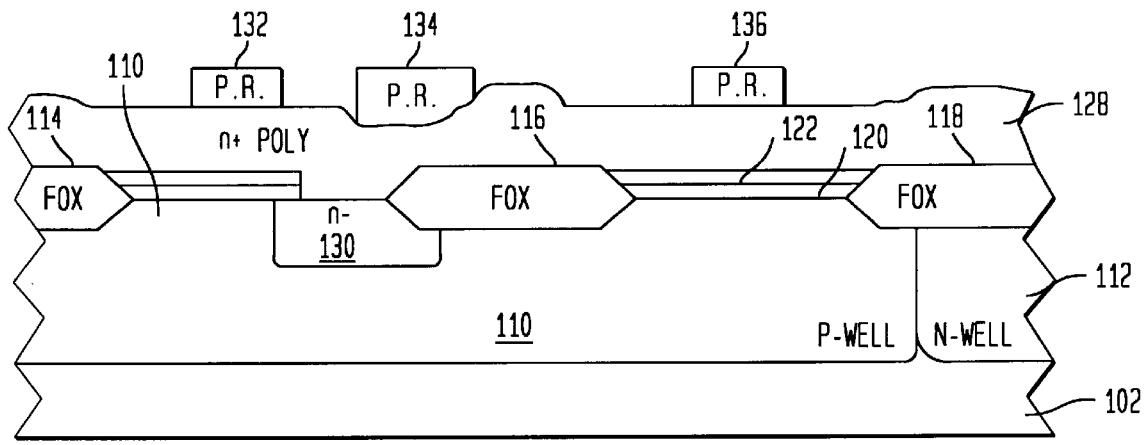

As shown in FIG. 8, the photo-resist layer 126 is then removed. A poly layer 128 is then formed (e.g., deposited) on the thin poly layer 122, FOX regions 114, 116 and 118 and exposed surface window 124. The poly layer 128 has a thickness of, for example, 0.32 $\mu$m and is heavily doped N$^+$ with ions, such as P, to a concentration of, for example, $10^{20}$ cm$^{31}$. A thermal cycle is then applied to the substrate. For example, the substrate 102 is heated at a temperature of, for example, 900° C., for a time period of, for example, 30 min. This causes some of the impurities in the poly layer 128 to diffuse through the substrate surface window 124 to form a lightly doped N$^-$ region 130 that is overlapped by, and in physical contact with, the poly layer 128. Illustratively, the lightly doped region 130 has a width of, for example, 0.7 $\mu$m, a depth of, for example, 0.6 $\mu$m and an impurity concentration of, for example, 10$^{18}$ cm$^{-3}$.

Figure 9:
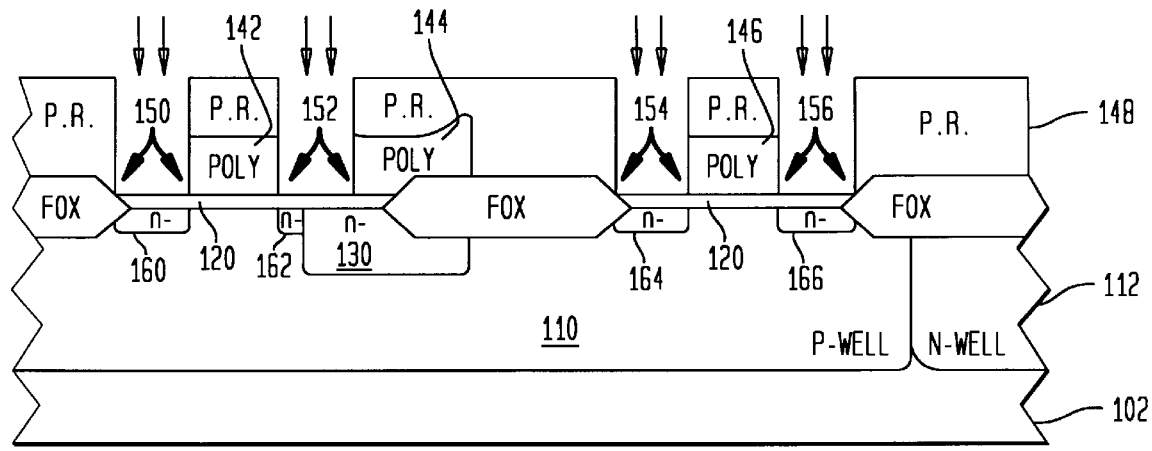

The poly layer 128 is patterned, e.g., by applying a photo-resist layer to the poly layer 128, selectively exposing the photo-resist layer through a mask and removing the non-exposed portions of the photo-resist layer. This forms photo-resist regions 132, 134 and 136 in the vicinity of a first poly gate of a first MOS device, a poly contact for a drain of the first MOS device and a poly gate of a second MOS device. The poly layer 128 is then etched using a suitable etchant, such as, Cl$_2$. As shown in FIG. 9, this forms poly gate 142 of the first MOS device, poly contact 144 and poly gate 146 of the second MOS device.

Next, in FIG. 9, an appropriate photo-resist layer 148 is formed on the poly gates 142, 146, poly contact region 144, FOX regions 114, 116 and 118 and thin gate oxide layer 120.

The photo-resist 148 is then patterned to expose surface windows 150, 152, 154 and 156 of the thin gate oxide layer 120 on opposite sides of each of the poly gates 142 and 146 which are adjacent to their respective poly gate 142 or 146. Next, ions, such as P, are implanted through the exposed surface windows 150, 152, 154 and 156 to form LDD (lightly doped drain) source and drain regions 160, 162, 164 and 166. For example, an energy of 70 keV, and a dosage of $5 \times 10^{13}$ cm$^{-2}$ may be used to produce source and drain regions 160, 162,164 and 166 with a doping concentration of, for example, $5 \times 10^{18}$ cm$^{-3}$ and a depth of, for example, 0.1 $\mu$m. Illustratively, the lightly doped source regions 160 and 164, and lightly doped drain region 166 have a width of, for example, 2.5. $\mu$m, whereas the lightly doped drain region 162 has a width of, for example, 0.2 $\mu$m.

Figure 10:
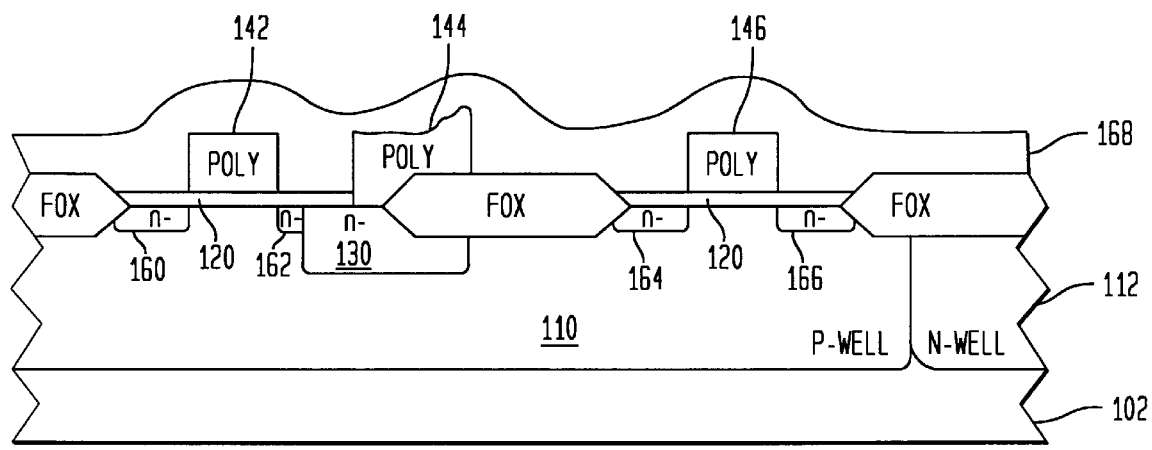
Figure 11:
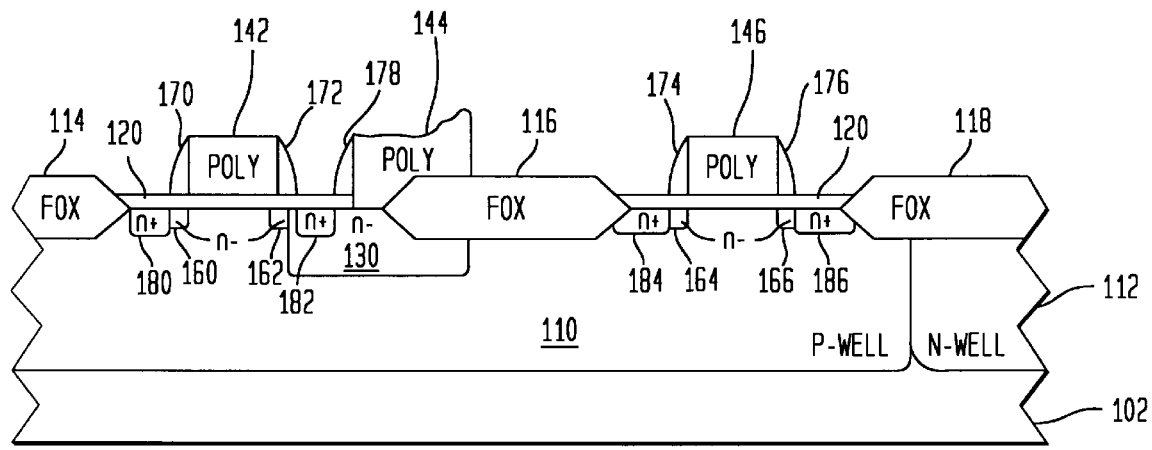

In FIG. 10, the photo-resist layer 148 is removed and a dielectric layer 168, such as SiO$_2$, is formed (deposited) on the poly gates 142, 146, poly contact region 144, FOX regions 114, 116 and 118 and thin gate oxide layer 120. As shown in FIG. 11, using an anisotropic etching technique, the dielectric layer 168 is etched to form spacers 170, 172, 174 and 176 adjacent to the side surfaces of each poly gate 142 and 146. A spacer 178 is also formed adjacent to the side of the poly contact 144 nearest the drain region 162.

As shown in FIG. 11, heavily doped regions 180, 182, 184 and 186 are illustratively formed below the substrate surface, e.g., by implanting ions, such as P using, for example, an energy of 80 keV and a dosage of $5 \times 10^{15}$ cm$^{-2}$. Illustratively this produces heavily doped source and drain regions 180, 182, 184 and 186 with an impurity concentration of, for example, about $10^{20}$ cm$^{-3}$ and a depth of, for example, about 0.2 $\mu$m. Illustratively, the heavily doped source regions 180 and 184, and heavily doped drain region 186 have a width of, for example, 2.3 $\mu$m, whereas the heavily doped drain region 182 has a width of, for example, 0.2 $\mu$m.

Figure 12:
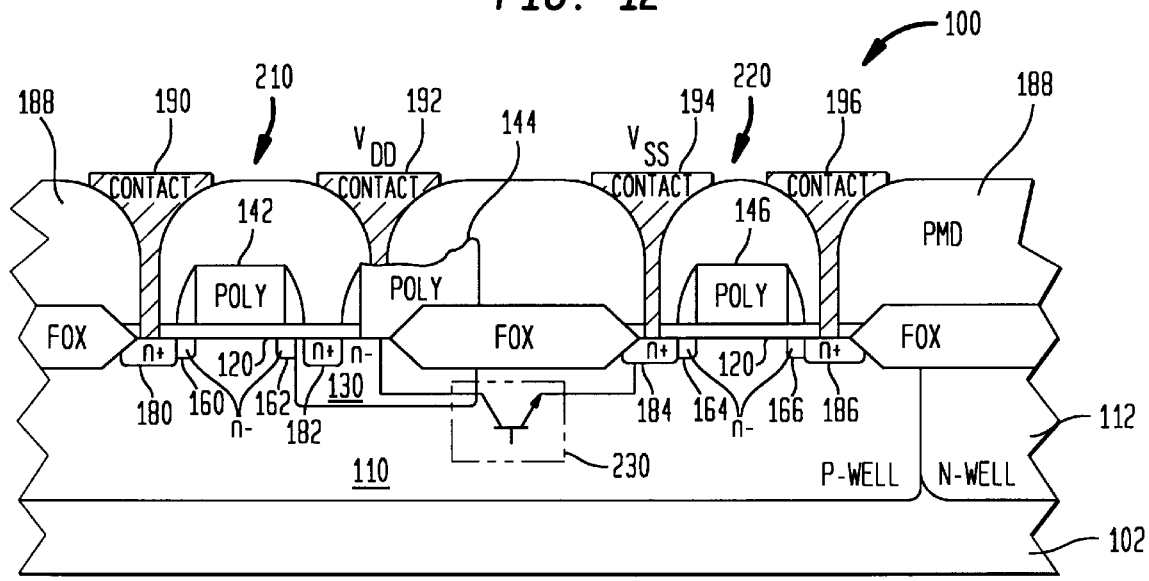

FIG. 12 shows the structure 100 according to an embodiment of the present invention. A first MOS device 210 is a MOSFET with poly gate 142 formed on thin gate oxide 120, a source including source regions 180 and 160, a drain including drain regions 162 and 182 and lightly doped region 130 and a channel including the portion of the P well 110 laterally juxtapositioned between the opposing side surfaces of the source region 160 and drain region 162. A second MOS device 220 is a MOSFET with poly gate 146 formed on thin gate oxide 120, a source including source regions 164 and 184, a drain including drain regions 166 and 186 and a channel including the portion of the P well 110 laterally juxtapositioned between opposing side surfaces of the source region 164 and the drain region 166. Also shown, is a PMD (pre-metal dielectric) layer 188 and metal (e.g., Al) contacts 190, 192, 194 and 196 to source region 180, poly contact region 144, source region 184 and drain region 186, respectively. The contact 190 connects the source region 180. The contact 192 connects the poly contact region 144 (and, therefore, drain contact 182) to the $V_{DD}$ power supply bus (see, e.g., FIGS. 1–4). The contact 194 connects the source region 184 to the $V_{SS}$ power supply bus (see, e.g., FIGS. 1–4). The contact 196 connects the drain region 186.

Figure 1:
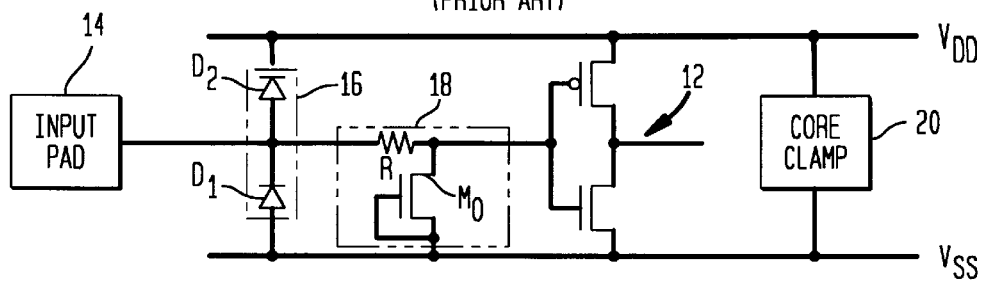
FIG. 1 shows a conventional ESD protected integrated circuit.
Figure 2:
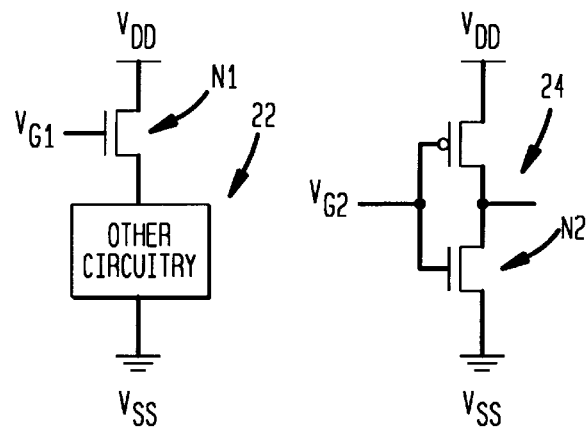
FIGS. 2–4 show a conventional internal circuit configuration with a parasitic bipolar junction device that is subject to ESD events despite the provision of ESD protection circuitry.
Figure 3:
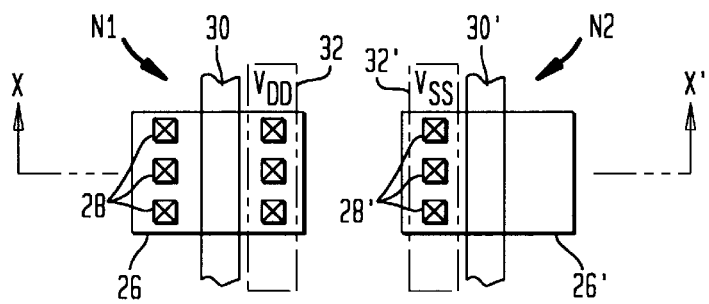
Figure 4:
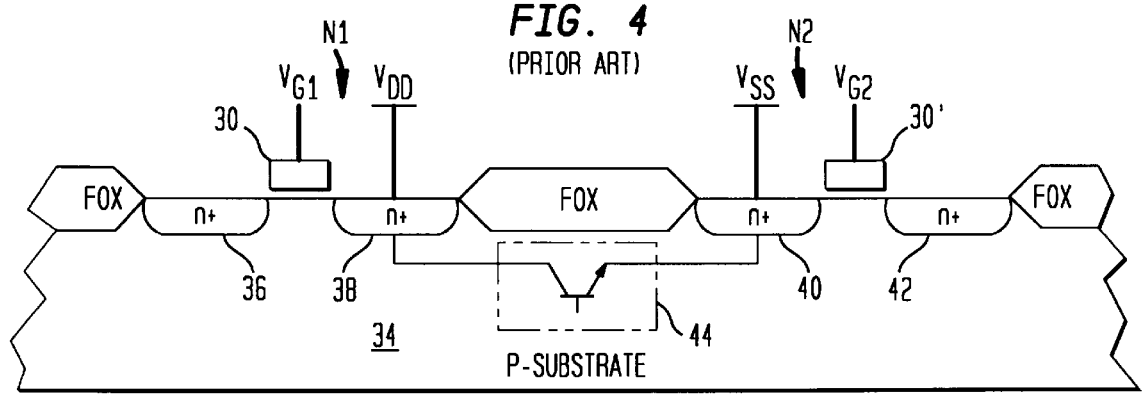

Illustratively, the ESD protected structure 100 is an internal device of an integrated circuit which includes ESD protection circuits such as are shown in FIG. 1. Specifically, at least a power bus ESD protection circuit, such as a core clamp, is provided for protection against ESD events which occur on, i.e. which apply ESD voltages across, the $V_{DD}$ and $V_{SS}$ power supply busses.

Consider now a parasitic bipolar junction device 230 which includes the drain 162, 182, 130 of the first MOSFET 210 as a collector, the bulk of the P well 110 between the lightly doped region 130 and the source region 184 as a base, and the source 164, 184 of the second MOSFET 220 as an emitter. The parasitic bipolar junction device 230 is a BJT. The lower impurity concentration of the lightly doped region 130 tends to increase the breakdown voltage of the base-collector pn junction. Whereas the breakdown voltage of the BJT 44 is only 13 volts, the breakdown voltage of the BJT 230 is increased to, for example, 18 volts. This reduces the likelihood that the parasitic BJT 230 will turn-on prior to the power supply ESD protection device during an ESD event (specifically, an ESD voltage applied between the $V_{DD}$ and $V_{SS}$ power supply buses).

Note also that the depth of the lightly doped region 130 is substantially greater than the depth of the drain regions 162, 182. This tends to reduce the occurrence of contact spiking which can result from an ESD event. In particular, because the N$^+$ drain region 182 is formed entirely within the lightly doped region 130, the possibility of forming a short circuit path between the N$^+$ drain region 182 and the P well 110 is reduced. Note also that the metal contact 192 is separated from the N$^+$ drain region 182 by the poly contact region 144. Because the metal contact 192 does not touch the N$^+$ drain region 182 directly, the likelihood of contact spiking at to the N$^+$ drain region 182, as a result of an ESD event on the power supply voltage $V_{DD}$, is further reduced.

Consider also that the lightly doped region 130 is very large having a volume and a surface area that are both larger than the volume and surface area of the drain region 182. In the event that the BJT 230 does breakdown and turn on, the ESD current will be dissipated through a larger surface area. This lowers the current density of the ESD current which reduces the likelihood of damage to the integrated circuit.

In short, an ESD protected structure and method of its fabrication arc disclosed. A heavily doped polycrystalline silicon contact region of a first conductivity type is disposed on a substrate surface and is connected to a power supply voltage. A lightly doped region, of the first conductivity type, is disposed below the substrate surface and is overlapped by, and in physical contact with, the polycrystalline silicon region. A first heavily doped region, of the first conductivity type, of a first MOS device is disposed below the substrate surface, and contained entirely within the lightly doped region. A second heavily doped region, of the first conductivity type, of a second MOS device, is disposed below the substrate surface, and separated from the first region by a portion of the lightly doped region and a second conductivity type doped portion of the substrate. The separation of the first and second regions by a portion of the lightly doped region increases a turn-on voltage of a bipolar junction device that includes the first and second regions, the portion of the lightly doped region and the second conductivity type doped portion of the substrate. The increase in turn on voltage, in turn, tends to prevent the bipolar junction device from turning on, during an ESD event, before an ESD protection device that protects the structure from ESD events which occur within the power supply voltage.

Finally, the above-discussion is intended to be merely illustrative of the invention. Numerous alternative embodiments may be devised by those having ordinary skill in the art without departing from the spirit and scope of the following claims.

The invention claimed is:

1. A bus to bus ESD protected structure connected between first and second power busses, comprising:
   a heavily doped polycrystalline silicon region, of a first conductivity type, formed on a substrate surface and connected to one of said power busses, a lightly doped region, of said first conductivity type, formed below a substrate surface and below said polycrystalline silicon region, a first heavily doped region, of said first conductivity type, of a first MOS device, disposed below a substrate surface, and contained entirely within said lightly doped region, and a second heavily doped region, of said first conductivity type, of a second MOS device, disposed below said substrate surface, and separated from said first region by a portion of said lightly doped region and a second conductivity type doped portion of said substrate, wherein said first heavily doped region and said second heavily doped region are each connected to a different one of said first and second power busses.

2. The structure of claim 1 wherein said separation of said first and second regions by a portion of said lightly doped region increases a turn-on voltage of a bipolar junction device including said first and second regions, said portion of said lightly doped region and said second conductivity type doped portion of said substrate.

3. The structure of claim 1 wherein said separation of said first and second regions by a portion of said lightly doped region prevents a bipolar junction device, including said first and second regions, said portion of said lightly doped region and said second conductivity type doped portion of said substrate, from turning on during an ESD event before an ESD protection device which protects said structure from ESD events which occur between said first and second power busses.

4. The structure of claim 1 wherein said first heavily doped region and said lightly doped region form a collector, said second heavily doped region forms an emitter and said second conductivity type portion forms a base of a parasitic bipolar junction transistor.

5. The structure of claim 1 wherein said lightly doped region comprises a larger surface area than said first heavily doped region through which an ESD current flows, during an ESD event, so as to reduce a current density of said ESD current.

6. The structure of claim 1 further comprising:

a metal contact formed on said heavily doped polycrystalline silicon region, for electrically connecting said first heavily doped region to one of said power busses, said metal contact being physically separated from said first heavily doped region so as to reduce a possibility of short circuiting said first heavily doped region to said second conductivity type portion of said substrate during an ESD event.

7. An integrated circuit comprising:

first and second power busses, an ESD protection device connected between said first and second power busses, and an internal circuit connected to said first and second power busses, said internal circuit comprising:

a heavily doped polycrystalline silicon region, of a first conductivity type, formed on a substrate surface and connected to one of said power busses, a lightly doped region, of said first conductivity type, formed below a substrate surface and below said polycrystalline silicon region, a first heavily doped region, of said first conductivity type, of a first MOS device, disposed below a substrate surface, and contained entirely within said lightly doped region, and a second heavily doped region, of said first conductivity type, of a second MOS device, disposed below said substrate surface, and separated from said first region by a portion of said lightly doped region and a second conductivity type doped portion of said substrate.

8. A bus to bus ESD protected semiconductor structure connected between first and second power busses comprising:

first and second MOSFETs, each MOSFET comprising:

a polycrystalline silicon gate formed on a substrate surface, a heavily doped drain region of a first conductivity type formed below said substrate surface, and a heavily doped source region of said first conductivity type formed below said substrate surface, a heavily doped polycrystalline silicon contact region, of said first conductivity type, formed on said substrate surface and connected to one of said power busses, and a lightly doped region, of said first conductivity type, formed below a substrate surface and below said polycrystalline silicon region, said MOSFETs being disposed so that one of said source or drain regions of said first MOSFET is formed entirely within said lightly doped region and is separated from one of said source or drain regions of said second MOSFET by a portion of said lightly doped region and a second conductivity type doped portion of said substrate, wherein said source or drain of said first MOSFET and said adjacent drain or source of said second MOSFET are each connected to a different one of said first and second power busses.

* * * * *